United States Patent [19]

Scherl

[11] Patent Number: 4,790,027

[45] Date of Patent: Dec. 6, 1988

[54] METHOD FOR AUTOMATIC SEPARATING USEFUL AND NOISE INFORMATION IN MICROSCOPIC IMAGES PARTICULARLY MICROSCOPIC IMAGES OF WAFER SURFACES

[75] Inventor: Wolfgang Scherl, Munich, Fed. Rep. of Germany

[73] Assignee: Siemens Aktiengesellschaft, Berlin and Munich, Fed. Rep. of Germany

[21] Appl. No.: 901,390

[22] Filed: Aug. 28, 1986

[30] Foreign Application Priority Data

Sep. 30, 1985 [DE] Fed. Rep. of Germany ....... 3534911

[51] Int. Cl.⁴ .......................... G06K 9/40; G06K 9/48
[52] U.S. Cl. ......................................... 382/54; 382/22
[58] Field of Search ....................... 382/22, 23, 50, 51, 382/54, 25

[56] References Cited

U.S. PATENT DOCUMENTS 4,433,438 2/1984 Couturier ............................. 382/22

FOREIGN PATENT DOCUMENTS 2161006 1/1986 United Kingdom ................. 382/22

Primary Examiner—James J. Groody
Assistant Examiner—Michael D. Parker
Attorney, Agent, or Firm—Hill, Van Santen, Steadman & Simpson

[57] ABSTRACT

A method for the automatic separating useful and noise information in microscopic images, particularly, microscopic images of wafer surfaces, for example, upon which printed circuits are formed for automatic recognition of wafer identifications which is divided into an image editing step, a conversion of the image content into a representation by data structures (FIG. 6) and also into actual separating steps for discriminating between noise and useful information. The method allows the automatic recognition of greatly disturbed wafer identifications. It allows then identification contours on a wafer to be reconstructed in an undisturbed manner even where there are extreme disturbances and where there is a very small signal to noise ratio.

4 Claims, 13 Drawing Sheets

RECONSTRUCTION OF THE ORIGINAL PATTERN EDGES FROM THE DATA STRUCTURE STORED COMPUTER-INTERNAL. THE EDGES ARE PROXIMATED BY POLYGON STROKES.

THE NUMERAL INFORMATION RECONSTRUCTED FROM THE DATA STRUCTURES AFTER THE CLEANING PROCESS.

CAMERA IMAGE OF A
NUMERAL ON THE
SEMICONDUCTOR
SUBSTRATE.

RESULT OF THE LOW-
PASS FILTERING

ELIMINATION OF DIS-
TURBING BRIGHTNESS
FLUCTUATIONS OF THE
SUBSTRATE BACKGROUND
BY MEANS OF BRIGHTNESS
STANDARDIZATION

THIS BLACK/WHITE
IMAGE ARISES FROM
FIG 3 BY MEANS OF
A FIXED IMAGE
THRESHOLD

RECONSTRUCTION OF THE ORIGINAL PATTERN EDGES FROM THE DATA STRUCTURE STORED COMPUTER-INTERNAL. THE EDGES ARE PROXIMATED BY POLYGON STROKES.

THE NUMERAL INFORMATION RECONSTRUCTED FROM THE DATA STRUCTURES AFTER THE CLEANING PROCESS.

CONVEX

CONCAVE

—— → CONVEX
--- → CONCAVE

CONVEX              CONCAVE

METHOD FOR AUTOMATIC SEPARATING USEFUL AND NOISE INFORMATION IN MICROSCOPIC IMAGES PARTICULARLY MICROSCOPIC IMAGES OF WAFER SURFACES

BACKGROUND OF THE INVENTION

1. Field of the Invention

The present invention relates to a method for automatic separation of useful and noise information in microscopic energy images, particularly, microscopic images of wafer surfaces as, for example, on silicon substrates for the purpose of automatic recognition of wafer identification.

2. Description of the Prior Art

Scanning and recognition apparatus and methods for text and images are known but such systems have worked only with images which have substantial contrast as, for example, printed material on paper.

SUMMARY OF THE INVENTION

For the identification of a wafer such as a micro circuit substrate in a manufacturing process, the wafer is clearly identified by numerals and/or letters in the basic material. It would be advantageous for further automation of the manufacturing process if these could be automatically read by a machine. The use of conventional optical reading devices are not feasible due to the extremely low contrast and extremely noise infested image information of the identification. Due to changing reflection behaviour and the thin impression of the edge contours, the numerals or letters appear with a very low signal to noise ratio and with great noise pickup. Standard methods for image enhancement and for pattern recognition can thus only very marginally be employed and under many circumstances are not successful.

A large massive data which must be allocated to the respective circuit occur in manufacturing and testing processes. When the wafer is to be correctly positioned in an automatic testing unit, this occurs using positional coordinates of the circuits on the wafer. It is necessary to forward specific measured values between individual automatic units of the manufacturing line and to provide them with correct information for the particular component. Due to carelessness on the part of operating personnel, for example, individual wafers can be interchanged. So as to enable a clear allocation of the measured data to the particular circuit requires an unequivocal identification be applied to the wafer. This is written into the substrate during manufacture of the wafer in a first processing step, for example, with a laser. FIG. 1 shows an identification comprising the numeral 9 on a semiconductor substrate.

For identification of the wafer, the identification must be automatically readable with a high reliability by every apparatus of the recording line. Methods of pattern recognition and imaging processing are required for these purposes. Devices which recognize numerals and written characters on this basis are commercially available and comprise document readers or full page readers. In the present invention however, the employment of the standard pattern recognition devices cannot operate successfully due to the specific nature of the images which are to be interpreted. First, as shown in FIG. 1, the contrast between useful information and the background is significantly lower than in the case where paper printed documents are used. Second, only numerals, or respectively, character contours become visible in the image. The great brightness fluctuations of the substrate background presents a further difficulty. The extremely unfavorable ratio of useful information to noise results from these factors and, in particular, reference is made to the image of FIG. 4 which results from the image of FIG. 1 after converting it into a black/white image. The separation of useful and noise information is thus not possible with standard pre-processing methods of known imaging processing technology.

It is an object of the present invention to provide a method for automatic separation of useful and noise information and microscopic optic images particularly in microscopic images of surfaces of wafer such as semiconductors for the purpose of automatic recognition of wafer identification which allow during the manufacturing processes the wafer to be automatically and reliably identified.

It is an object of the present invention to provide a method for automatic separation of useful and noise information in microscopic images as, for example, of wafer surfaces wherein the microscopic image is read by means of a video camera and the image resulting is converted into a low contrast image using a low pass filter and then standardizing the existing gray tones according to an equation wherein the original image is converted into an image free of brightness fluctuations and a black/white image is produced by evaluating the picture element information of the image free of brightness fluctuations by means of permanently prescribed picture element brightness threshold and the edges of noise and useful components occurring in the black/white image are approximated by polygon strokes by means of a tangential point identification method such that the tangential points for a saddle (S), branching (F), bottom point (B) or a top point (T) are identified when scanning the images in four directions such as 0°, 45°, 90° and 135° such that the image content is converted into a data arrangement which can be plotted for test purposes and the noise elements still present in the data structure are eliminated from the digital image description by means of simple predetermined dimensioning criteria so that the original identifical structure can be reconstructed and the identification features can be recognized.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
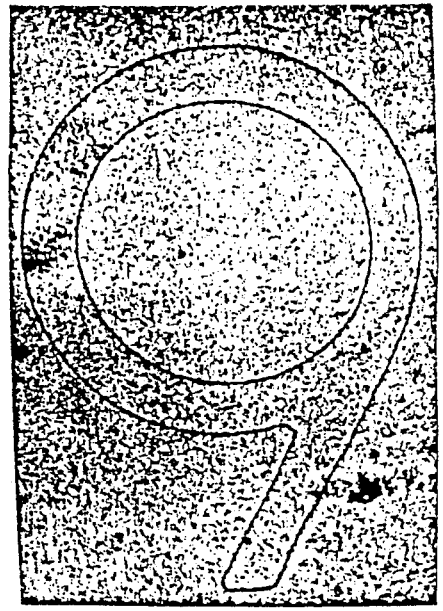
FIG. 1 illustrates an image resulting from a video camera pickup of a numeral on a semiconductor substrate.

FIG. 1 illustrates an image of a numeral, 9, on a semiconductor substrate which is obtained, for example, by using a camera pickup scanning through a microscope. The image of FIG. 1 obtained by scanning with a video camera is converted into a low contrast image such as shown in FIG. 2 wherein the image of FIG. 1 is converted into a low contrast image using a low pass filter.

Figure 2:
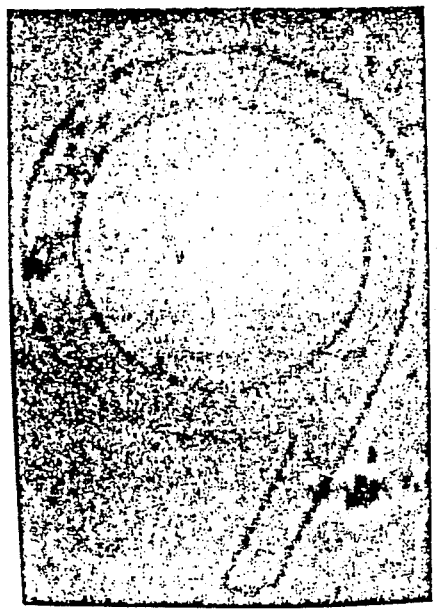
FIG. 2 illustrates an image which has been processed with low pass filtering fromthe image of FIG. 1.
Figure 3:
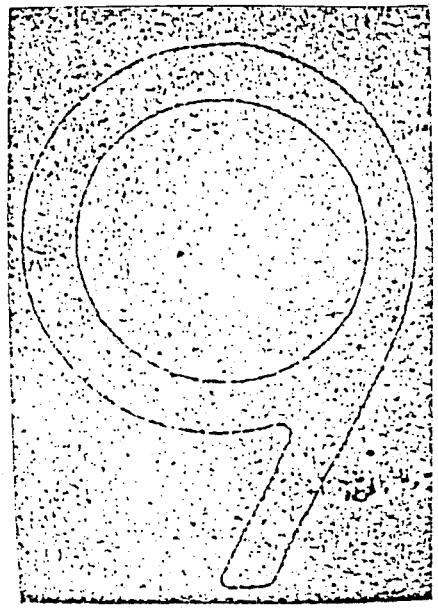
FIG. 3 illustrates an image resulting from the combination of the images in FIGS. 1 and 2 following elimination of disturbing brightness fluctuations of the substrate background by brightness standardizing.

By standardization of the existing gray tones according to the equation $$B3=(B1/B2-D)F,$$

the original image illustrated in FIG. 1 is converted into an image illustrated in FIG. 3 which s free of disturbing brightness fluctuations wherein B1, B2 and B3 are mutually corresponding picture elements of the images of FIGS. 1, 2, or 3 and D and F are standardization constants. The constant D effects the brightness minimum that is placed in the gray tone "0". The constant F is defined such that the brightness image part in B3 lies on the value "255" which is the brightness standardization. The identification of these two constants are obtained by a trial run. By evaluating the picture element information of the image of FIG. 3 which is free of brightness fluctuations, a black/white image such as shown in FIG. 4 is obtained either by means of a permanently prescribed picture element brightness threshold or by means of a variable threshold which is identified in a known manner by an evaluation of the gray tone histogram from image 3 shown in FIG. 3.

Figure 4:
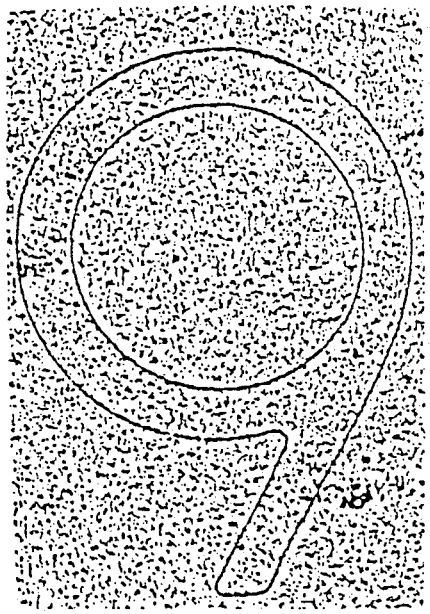
FIG. 4 illustrates an image obtained from the image of FIG. 3 after application of a fixed image threshold.
Figure 5:
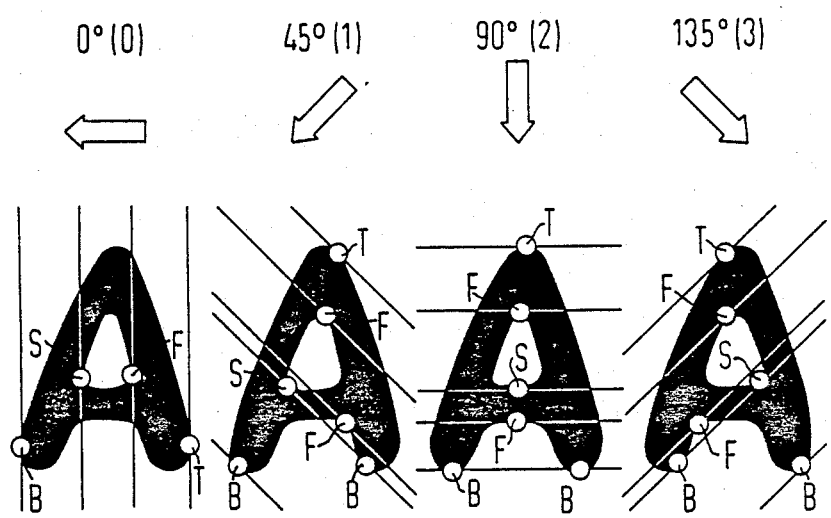
FIG. 5 schematically shows a submethod for identification of tangential points which are identified by scanning the edges of identification symbols in four directions.
Figure 6:
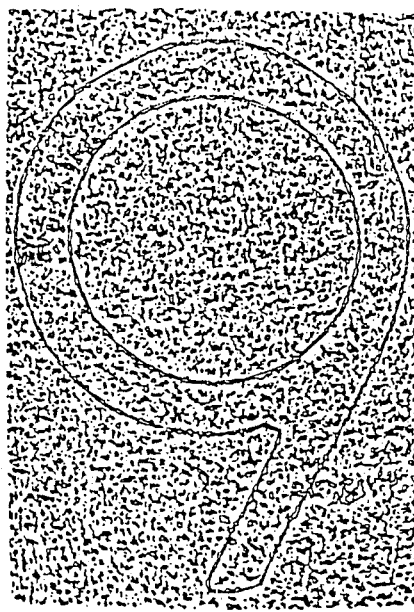
FIG. 6 shows reconstruction of data for an image which was stored in a computer which was accomplished with plotters.
Figure 7:
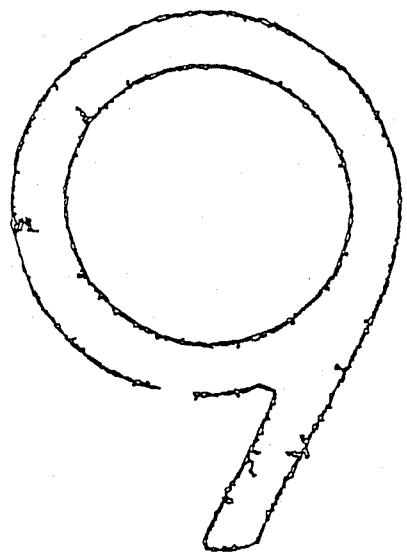
FIG. 7 illustrates an image which represents a numeral reconstructed from the data after a cleaning operation.

The edges of noise and useful components occurring in the black/white image of FIG. 4 are approximated by polygon strokes by using a tangential point identification method such as known from German OS No. 32 38 706 and No. 32 36 336 as shown in FIG. 5 such that respective tangential points for a saddle "S", branching "F", a base point "D" or, respectively, a head point "T" are identified when scanning the edges and preferably four directions such as 0°, 45°, 90°, and 135°. After the scanning, the image content is converted ito a data structure which can be plotted for test purposes as illustrated in FIG. 6. Then by using simple predetermined dimensioning criteria, the noise element still present in the data structure of FIG. 6 are eliminated by the digital image description established by the data structure so that the original identification structure free of noise elements can be reconstructed as shown in FIG. 7. Then automatic identification recognition and additional steps required in the manufacturing proces can occur in the manufacturing apparatus wherein the identification has been corrected and improved according to the invention.

According to an advantageous development of the invention, the conversion of the original image of FIG. 1 into the low contrast image of FIG. 2 is accomplished by means of a rectangular filter having the edge length of 11×11 picture elements (pixels).

According to the present invention, the method steps set forth above can be controlled with a computer.

Figure 8:
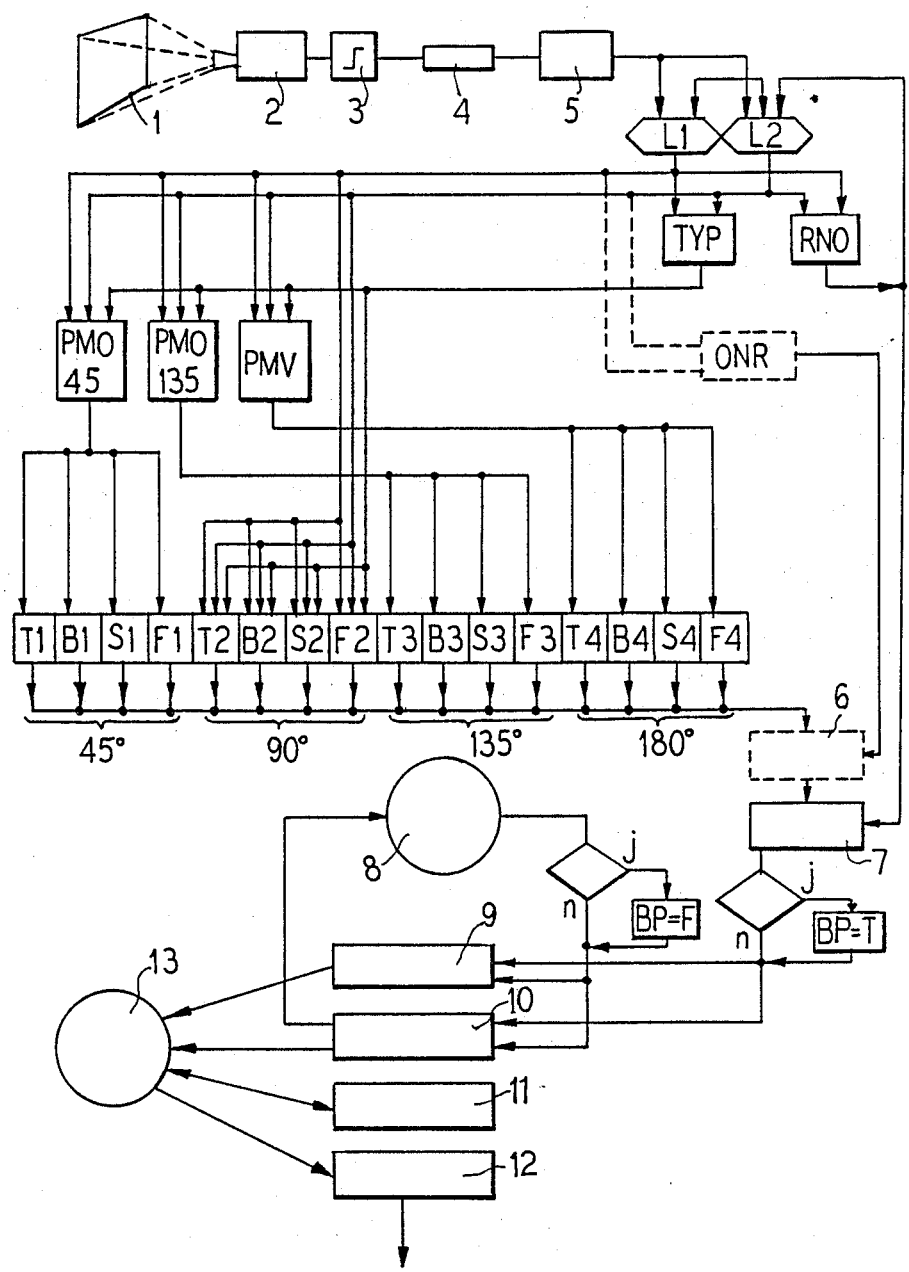
FIG. 8 illustrates a scanning system.

FIG. 8 shows a schematic illustration that contains a scanning system composed of an artwork original 1, of a scanner 2 that is preferably executed as a video camera, a threshold circuit 3, a two-line image store 4, what is referred to as an event computer 5 that supplies lists L1, L2, various program modules such as TYP, RND, ONR, PMD45°, PMD135°, PMV180° and further program modules such as 6, 7, 9 and 12, and a buffer memory 8 as well as an arc memory 13.

Figure 9:
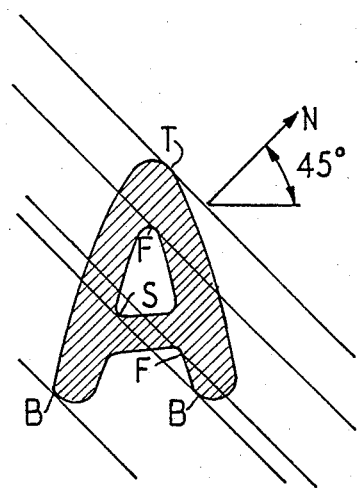
FIG. 9 is a schematic illustration of a print symbol.

FIG. 9 shows a schematic illustration of a print symbol contained in an original for scanning, wherein the indicated tangent to a normal of 45° and the appertaining descriptors are entered.

Figure 10:
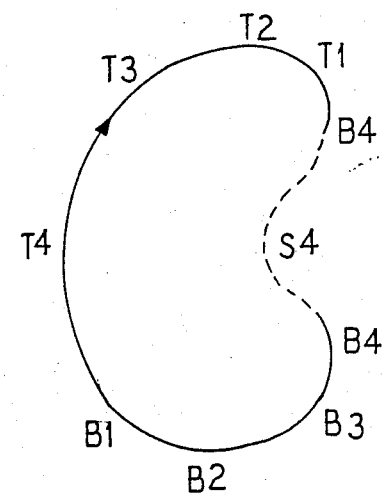
FIG. 10 illustrates an arbitrarily selected circumference of a symbol area.

FIG. 10 schematically shows an arbitrarily selected circumference of a symbol area for illustration of various descriptor positions T1 through T4, B1 through B4 and S4 along a convex arc that is drawn with a solid line and along a concave arc that is shown with dotted lines.

Figure 11:
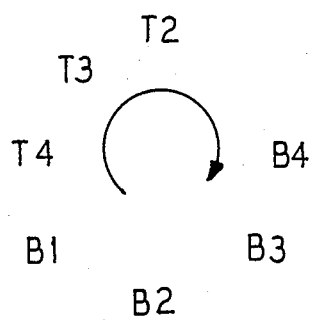
FIG. 11 schematically shows convex and concave descriptor cycles.
Figure 11:
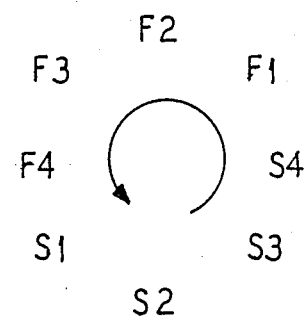

FIG. 11 schematically shows a respective convex and a respective concave descriptor cycle and the appertaining cycle directions.

Figure 12:
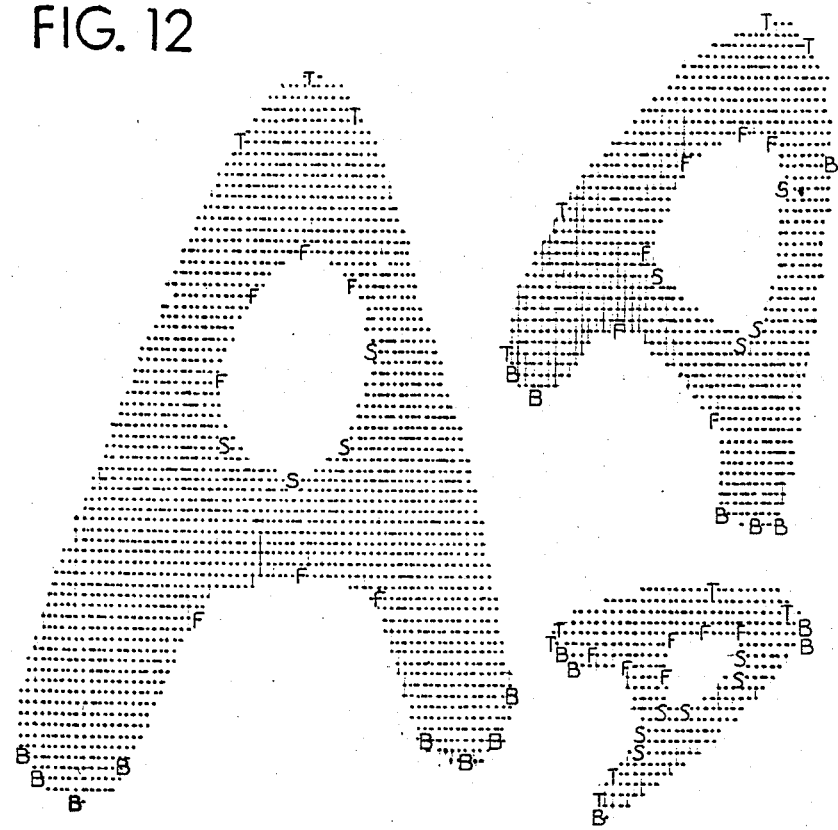
FIG. 12 shows a plurality of picture element patterns for a text symbol.

FIG. 12 shows a plurality of picture element patterns for a text symbol from an artwork original, namely with various rotational positions and various sizes, with entered decriptor symbols.

Figure 13:
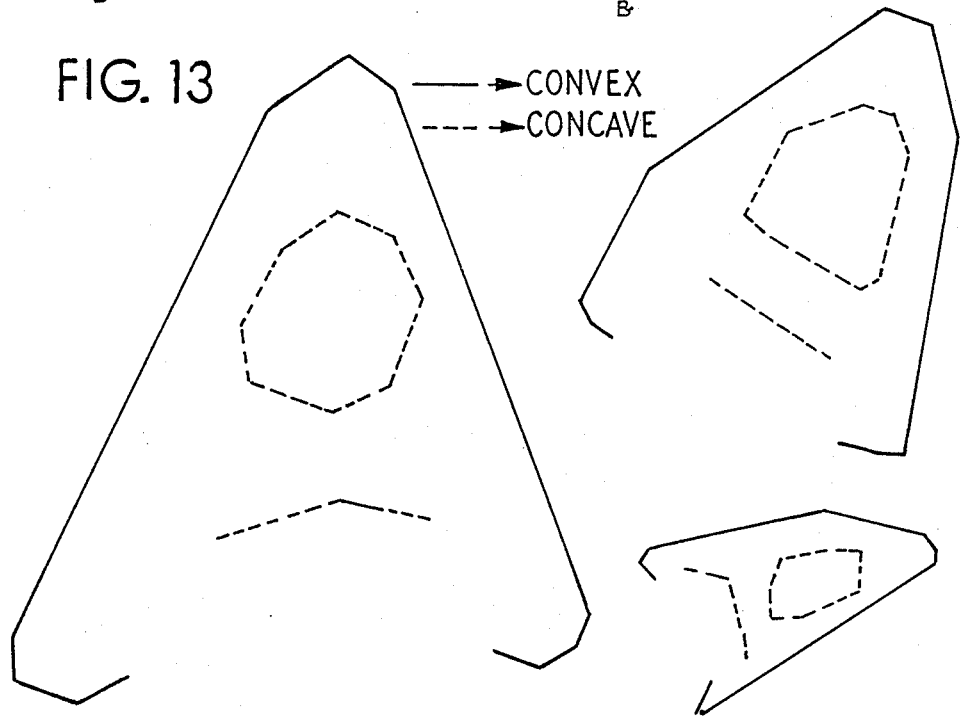
FIG. 13 shows arc structures obtained after processing.

FIG. 13 shows the arc structures that have arisen as a result of the processing.

Figure 14:
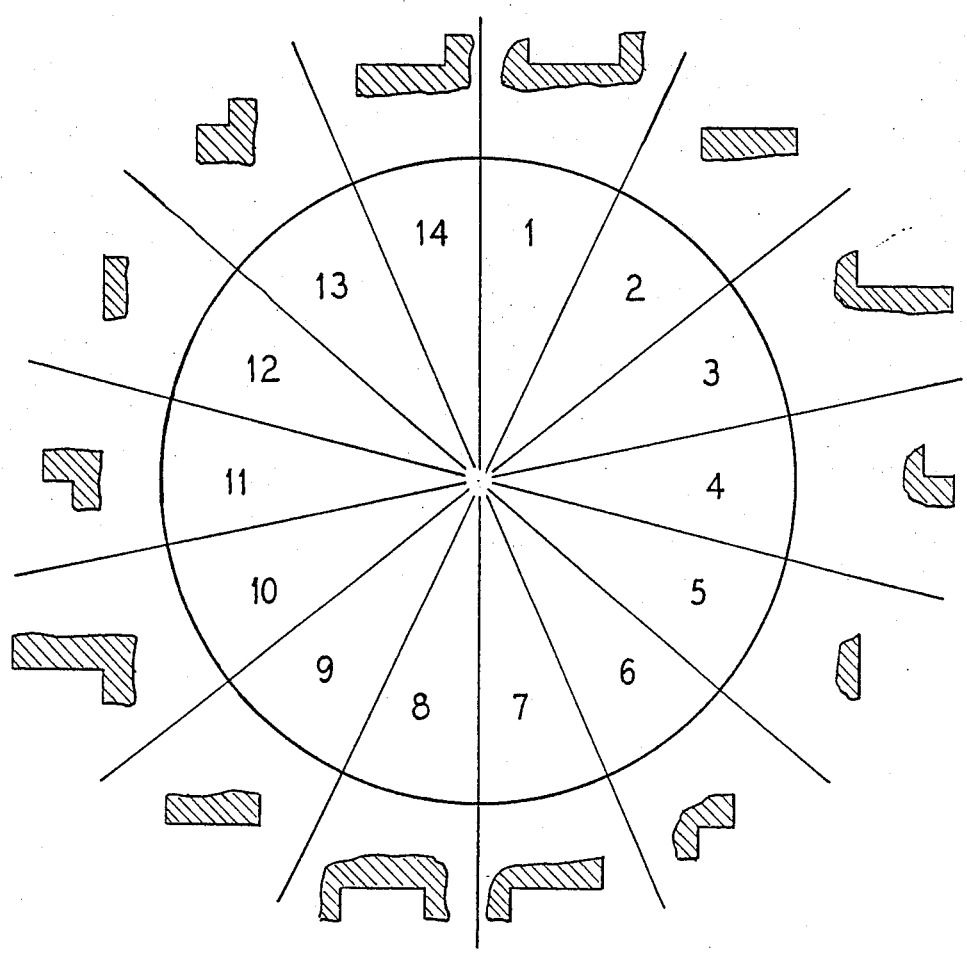
FIG. 14 is a schematic overview of possible basic pattern types.

FIG. 14 shows a schematic overview of the possible basic pattern types 1 through 14 in two successive scan lines.

As already set forth, FIG. 8 shows a scanning system of the present invention. A scanner means 2 is moved over an artwork original 1 in a known way. The analog image signals thereby arising are digitized in a known way in a threshold arrangement 3 and are then input into a two-line image store. An event computer 5 following the two-line image store 4 accepts the stored image data and works them off with lists L1 and L2. In accord with the invention, the image of the artwork original 1 present as digital information is thereby analyzed from different projection directions, to which end the program module PMD45°, PMD135° and PMV serve to produce the projection from the indicated angles. Arrising as result of these processing operations are descriptors TBSF for the group "upper edge", "lower edge", "saddle" and "branching", respectively arising for the scanning directions 45°, 90°, 135° and 180°. As may be derived from FIG. 8, a program module TYB also serves that purpose in addition to te lists L1, L2. Further program modules RND and ONR each initiate a process of "allocation area" in a further program module 6 or, respectively, "allocation edge" in anothe rprogram module 7. The respsective element numbers or, respectively, edge numbers are allocated to the obtained descriptors T1 ... F1, T2 ... F2, T3 ... F3, as well as T4 ... F4 in these processes.

The descriptors from the program module 7 for the process of "allocation edge" are subjected to a decision with the question "new line". This question is negatively answered when the descriptor was calculated in the same image line as its predecessor. When this is the case, then the descriptor is directly entered into the arc memory 13 via the modules 9 and 10. When an entry is not possible, an intermediate storage ensues in the buffer 8. The above question is positively answered when the pending descriptor and its predecessor were calculated in different image lines. In this case, a buffer flag BP is set to TRUE. This effects that the program modules 9 and 10 work off the descriptors stored in the buffer 8 and enter them into 13 before the processing of the new descriptor. When the buffer 8 is empty, the buffer flag BP is set to FALSE and the pending descriptor is processed by 9 and 10.

The program module 9 effects that the first descriptor of a newly found arc initiates a new entry into the head lists of an arc memory 13. Further, every descriptor is allocated to the appertaining arc in accord with the edge number allocated to it and is communicated to the arc memory 13 via the program module 10 ("entry") or, respectively, is intermediately stored in the buffer 8.

When every plurality of arc fragments flow together to form a respective arc, the appertaining lists and memory entries are combined to form a single entry. This occurs in the program module 11 ("combination"). The memories and head lists thereby affected are cleared parallel to this event.

When an arc has been completely described by its descriptors, then the information relating to this arc are taken from the arc memory 13 and are supplied to a further processing, for example a written character recognition process. This occurs in the last program module 12 ("page out"). In addition, the appertaining head lists are correspondingly cleared.

As already explained, FIG. 9 shows a schematic illustration of a text symbol that is contacted by tangents that reide perpendicular to a normal of 45°, whereby the appertaining descriptors that derive, namely T, F, S, B for "upper edge", "branching", "saddle point", and "lower edge" are entered at the points the tangent touches.

As already explained, FIG. 10 schematically shows an arbitrarily defined circumference of a symbol in the master to be scanned, comprising entered descriptors that are arranged along the outside line of the shown area. The solid part of the circumferential line thereby represents a convex arc, as may be seen, and the dotted part represents a concave arc.

As already explained, FIG. 11 shows schematic illustrations of a respective convex and a respective concave description cycle with indicated descriptors as well as with the appertaining cycle directions for convex or, respectively, concave arcs.

FIG. 12 shows a text symbol composed of a multitude of picture elements in different rotational positions and/or sizes with the entered descriptor symbols. It may be seen from this figure that the distribution of the descriptors in accord with the object of the invention does not change despite different rotational positions and despite different sizes.

FIG. 13 shows the result of the combination of the descriptors from FIG. 12 to form concave and convex arcs. This figures shows that the arising data structures are independent of size and rotational position.

FIG. 14, finally, provides an overview of the possible basic pattern types in two successive scan lines.

Figure 15:
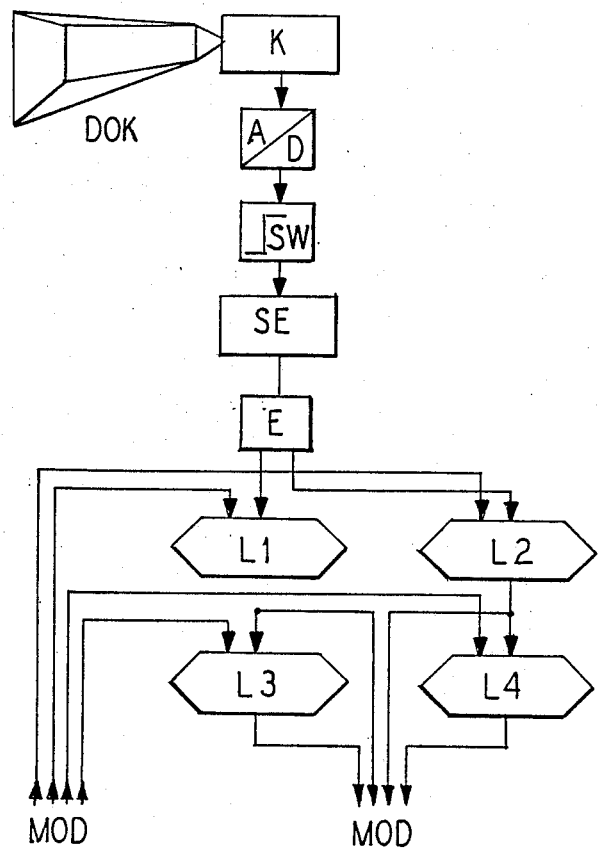
FIG. 15 is a block circuit diagram for illustrating the invention.

FIG. 15 schematically shows a block circuit diagram of an exemplary embodiment of the present invention, whereby a document DOK is scanned line-by-line a known way by a camera, preferably by a video camera K. After passing through a number of preliminary stages that shall be discussed in greater detail below, digitized image signals are supplied to a one-line image store SE from which an event computer E calls the appertaining data, processes them and supplies them to a list system L1, L2, L3, L4.

Figure 16:
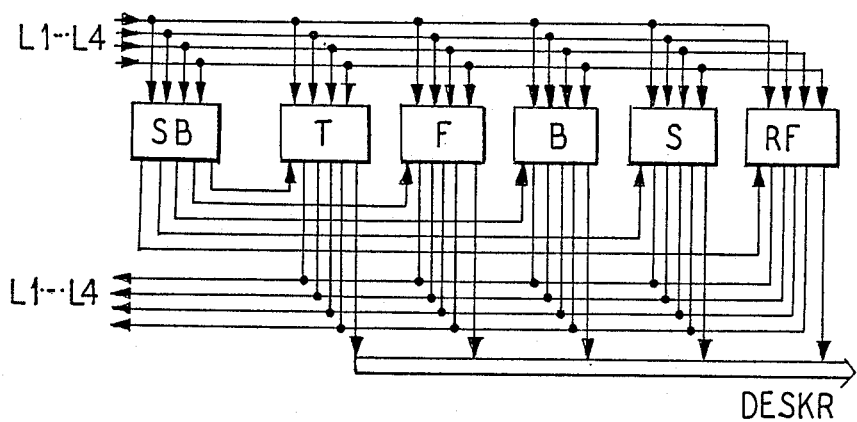
FIG. 16 is a block circuit diagram for illustrating the invention.

FIG. 16 schematically shows a block circuit diagram comprising data lines that come from the lists L1 ... L4, comprising data lines that lead to the lists L1 ... L4, and various modules SB, T, F, B, S and RF as well as a data line leading to a FIG. 17 via which extracted decriptors DESKR are supplied to an arrangement of administration lines and data lists.

Figure 17:
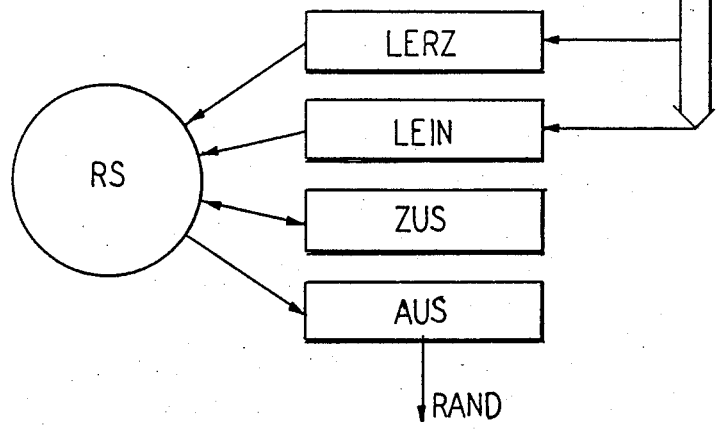
FIG. 17 illustrates schematically an arrangement of the data lists.

FIG. 17 shows a schematically illustrated arrangement of data lists LERZ (generate), LEIN (enter), ZUS (combine), AUS (page out) and an edge memory RS that contains the administration lists.

Figure 18:
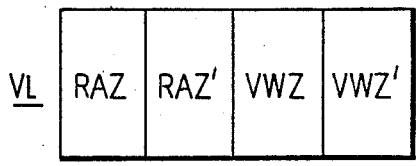
FIG. 18 illustrates the administration lists.

FIG. 18 shows the structure of the administration lists. The administration lists are composed of an edge connection module for edge connection data in the cycle sense RAZ', of an edge connection module for the administration of edge connection numbers opposite the cycle sense RAZ, a reference module for the administration of the data in the cycle sense VWZ and a reference module for the administration of the data opposite the cycle sense VWZ'.

Figure 19:
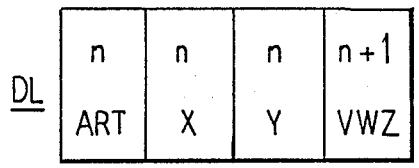
FIG. 19 illustrates the data lists for intermediate storage of various information.

FIG. 19 shows the structure of the data lists for intermediate storage of the type ARD, of the X-coordinate X, of the Y-coordinate Y and of the reference data in the cycle sense VWZ.

Figure 20:
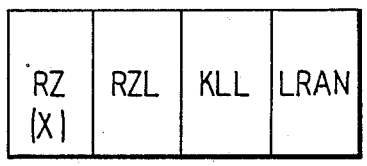
FIG. 20 illustrates the structure of certain lists used in the invention.

FIG. 20 shows the structure of the lists L1 ... L4, whereby [...] contains list for storing the X-coordinates edge RZ, a list for the edge conditions RZL, a list for the edge length data KLL and a list of the edge connection numbers LRAN.

Figure 21:
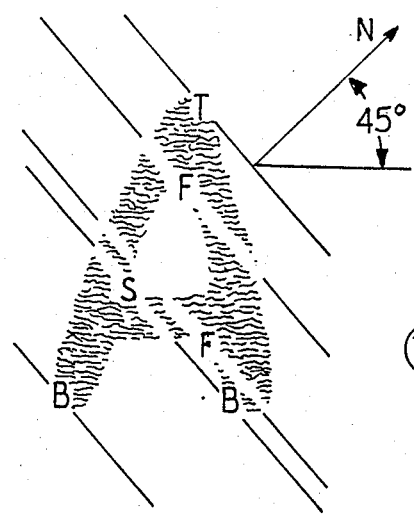
FIG. 21 is a schematic illustration of a text symbol.

FIG. 21 shows a schematic illustration of a text symbol that is touched by tangents that reside perpendicular to a normal of 45°, whereby the deriving, appertaining descriptors, namely T, F, S, B for "upper edge", "branching", "saddle point" and "lower edge" are entered at the points the tangent touch.

Figure 22:
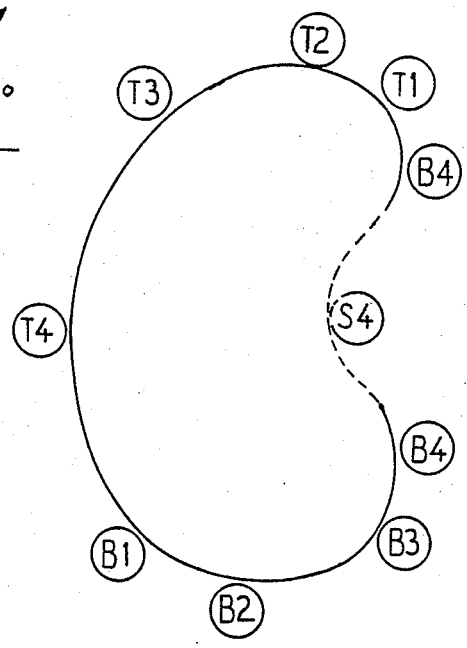
FIG. 22 shows schematically arbitrarily defined circumference of a symbol.

FIG. 22 schematically shows an arbitrarily defined circumference of a symbol in the original to be scanned, comprising entered descriptors that are arranged along the outside line of the illustrated area.

As may be seen, the solid part of the circumferential line thereby represent a convex arc and the dotted part represents a concave arc.

Figure 23:
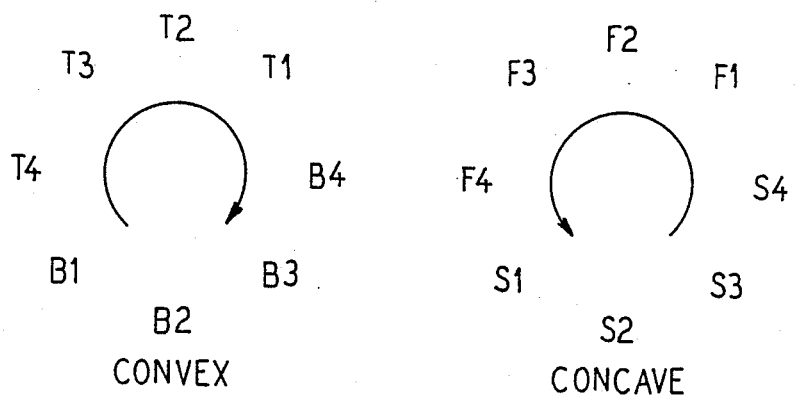
FIG. 23 is a schematic illustration of convex and concave descriptor cycles.

FIG. 23 shows schematic illustrations of a respective convex or of a respective concave descriptor cycle having indicated descriptors as well as having the appertaining cycle directions for convex or, respectively, concave arcs.

Figure 24:
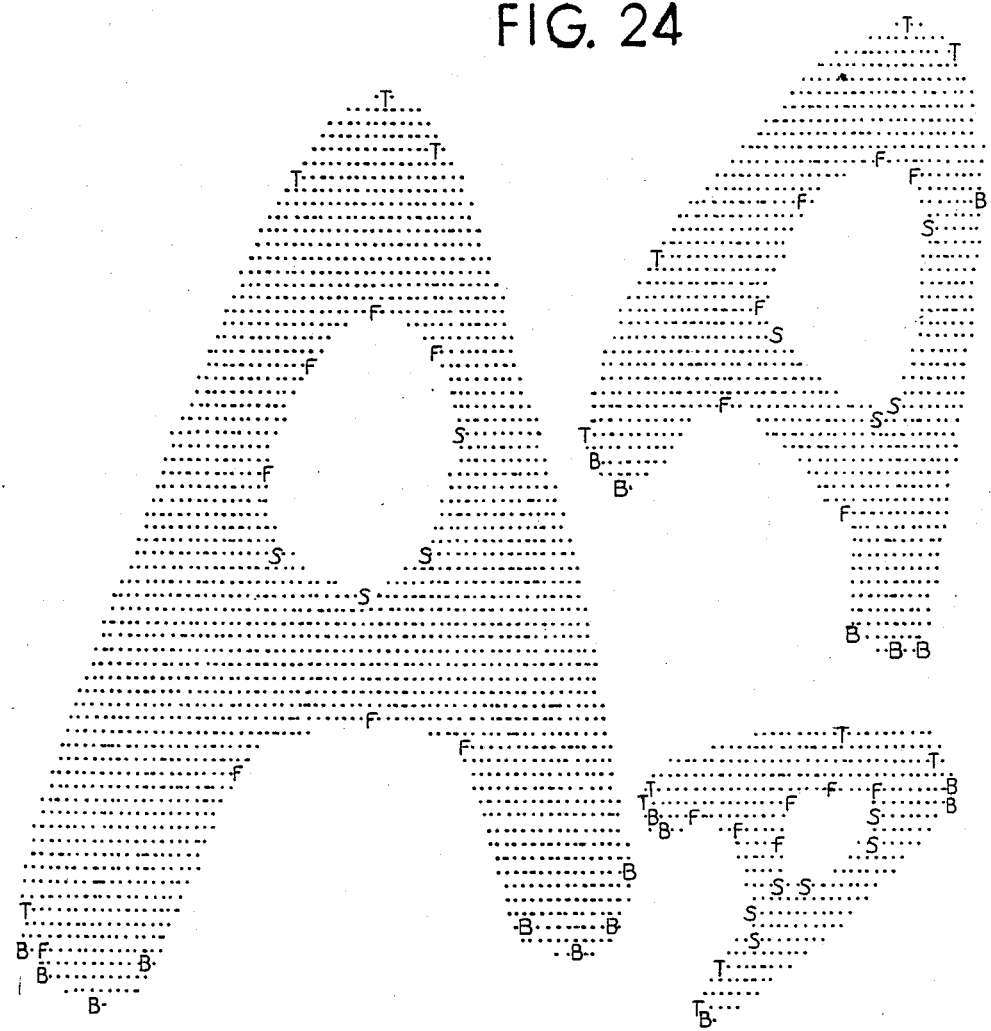
FIG. 24 illustrates a number of picture elements in different rotational positions.

FIG. 24 shows a text symbol composed of a multitude of picture elements in different rotational positions and/or sizes with the entered descriptor symbols. It may be seen from this figure that the distribution of the descriptors in accord with the object of the invention does not change despite different rotational positions and despite different sizes.

Figure 25:
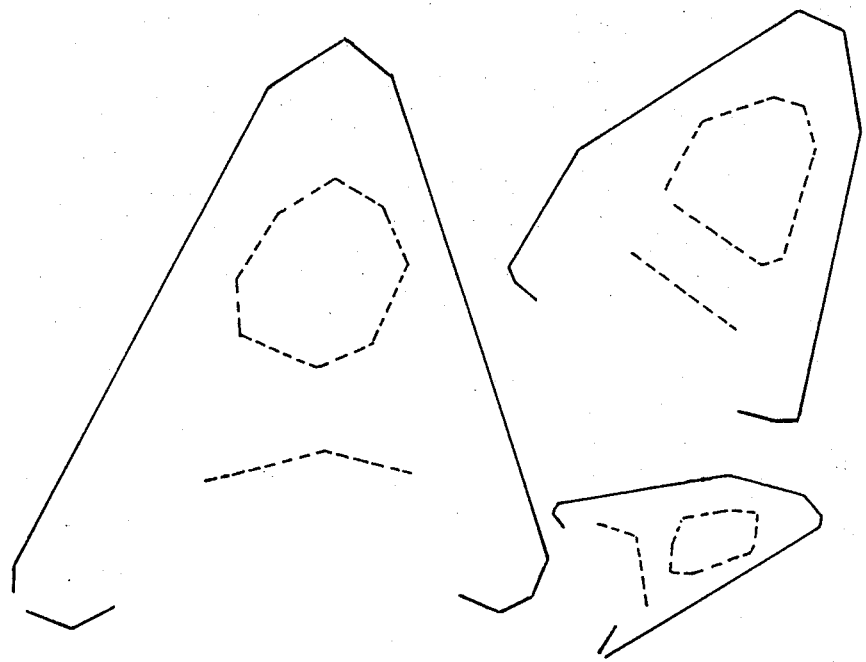
FIG. 25 illustrates combining descriptors from FIG. 24 to form concave and convex arcs.

FIG. 25 shows the result of the combination of the descriptors from FIG. 10 to form concave and convex arcs. This figure shows that the data structures that have arisen are independent of size and rotational position.

As already explained, FIG. 15, FIG. 16 and FIG. 17 show schematic illustrations of an exemplary embodiment of the present invention, whereby an A/D converter is arranged following the camera K scanning the document DOK in FIG. 15, and a threshold evaluation circuit SW is arranged following this A/D converter, said threshold evaluation circuit SW being connected to the one-line image store SE from which there is a connection to the event computer E. As already set forth above, lists of a momentary line, lists of a predecessor line, namely for left-hand edges, namely L1, L3, as well as for right-hand edges, L2, L4 are contained in the lists L1 ... L4. The lists L1 ... L4 are connected to the modules in FIG. 2, namely SB, T, F, B, S and RF, via data lines in the way shown. It may be seen in FIG. 16 that these modules in turn comprise data line connections to the lists L1 ... L4. A data line for descriptors is connected in the multiple to the modules for "upper edge" T, "branching" F, "lower edge" B and "saddle points" S as well as to the module for the edge continuation RF. This data line leads to the arrangement of edge (arc) memories RS shown in FIG. 17 as well as to data lists corresponding to these edge memories RS for generating edges (arcs) LERZ, for entering said edges LEIN, for combining edges (arcs) ZUS and for paging out edges (arcs) AUS. An arrangement for farther-reaching processing of the edges (arcs) that is not included in the subject matter of the present invention is to be provided following the last data list, namely for the page out AUS. The further FIGS. 18 through 25 have already been set forth above in a way adequate for the disclosure.

Although the invention has been described with respect to preferred embodiments, it is not to be so limited as changes and modifications can be made which are within the full intended scope of the invention as defined by the appended claims.

I claim as my invention:

1. A method for automatic separation of useful and noise information in microscope images, particularly microscope images of wafer surfaces, for the purpose of automatic recognition of wafer identification characterized in reading a microscope image with a video camera; low pass filtering an image obtained by said reading (FIG. 1) to convert it into a low-contrast image (FIG. 2), standardizing the low pass filtered image by the existing gray tones according to the equation $$B3 = (B1/B2 - D)F$$

to obtain a standardized image (FIG. 3) free of disturbing brightness fluctuations, where B1, B2 and B3 are mutually corresponding picture elements of the microscope, low contrast and standardized images (FIG. 1, FIG. 2 and, respectively, FIG. 3), and D and F are standardization constants defined by trial runs; producing a black/white image by evaluating the picture element information of the standardized image (FIG. 3) free of brightness fluctuations, using a permanently prescribed picture element brightness threshold; approximating both the edges of noise and useful components existing in the black/white image (FIG. 4) using polygon strokes with a tangential point identification method (FIG. 5) so that, repsective, tangential points for a saddle (S), a branching (F), a bottom point (B) or a top point (T) are identified when scanning the edges in four directions (0°, 45°, 90°, 135°), for which purpose the image content is converted into a data structure containing a digital image which can be plotted for test purpose (FIG. 6); eliminating the noise still present in the data structure (cf. FIG. 6) from the digital image which are eliminated by simple, predetermined dimensioning criteria so that the original identification structure free of noise elements can be accurately reconstructed (FIG. 7); and automatically identified.

2. A method according to claim 1, characterized in that the filtering of the original image (FIG. 1) into the low-contrast image (FIG. 2) is accomplished with a rectangular filter having an edge length of 11×11 picture elements (pixels).

3. A method according to claim 1, characterized in that the method steps are computer controlled.

4. A method according to claim 1, characterized in that the standardized image free of brightness fluctuations is converted into said black/white image by use of a variable threshold, whereby the variable threshold is identified from the gray tone histogram of the image free of brightness fluctuations.

* * * * *